(12) United States Patent
Kang et al.

(10) Patent No.: US 8,581,945 B2
(45) Date of Patent: Nov. 12, 2013

(54) LIGHT EMITTING DIODE ARRAY INCLUDING APERTURES, LINE PRINTER HEAD, AND METHOD OF MANUFACTURING THE LIGHT EMITTING DIODE ARRAY

(75) Inventors: Seok-Jin Kang, Suwon-si (KR); Hyung Choi, Seongnam-si (KR); Eung-Yeoul Yoon, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 248 days.

(21) Appl. No.: 12/923,867

(22) Filed: Oct. 12, 2010

(65) Prior Publication Data

US 2011/0096134 A1   Apr. 28, 2011

(30) Foreign Application Priority Data

Oct. 22, 2009   (KR) .................. 10-2009-0100771

(51) Int. Cl.
*B41J 2/385*   (2006.01)
*B41J 2/455*   (2006.01)

(52) U.S. Cl.
USPC ........................................ 347/130; 347/233

(58) Field of Classification Search
None
See application file for complete search history.

(56) References Cited

U.S. PATENT DOCUMENTS

| | | | |
|---|---|---|---|
| 5,617,131 A * | 4/1997 | Murano et al. | 347/233 |
| 7,609,285 B2 * | 10/2009 | Miyazawa | 347/238 |
| 2002/0114051 A1 * | 8/2002 | Atsuumi | 359/205 |
| 2003/0063783 A1 * | 4/2003 | Higuchi | 382/125 |
| 2003/0218666 A1 * | 11/2003 | Holm et al. | 347/130 |
| 2007/0284564 A1 * | 12/2007 | Biwa et al. | 257/13 |
| 2008/0080897 A1 * | 4/2008 | Gomi | 399/221 |
| 2008/0251808 A1 * | 10/2008 | Kususe et al. | 257/98 |
| 2009/0050905 A1 * | 2/2009 | Abu-Ageel | 257/80 |
| 2009/0315965 A1 * | 12/2009 | Yamagata et al. | 347/130 |

* cited by examiner

*Primary Examiner* — Stephen Meier
*Assistant Examiner* — Tracey McMillion
(74) *Attorney, Agent, or Firm* — Staas & Halsey LLP

(57) ABSTRACT

A light emitting diode array including apertures, a line printer head using the light emitting diode array, and a method of manufacturing the light emitting diode array. The light emitting diode array includes the apertures that are formed in a substrate and restrict tunnels of light emitted from a plurality of light emitting diodes. Also, a lens that refracts the light transmitted through the plurality of apertures is included.

50 Claims, 19 Drawing Sheets

LIGHT EMITTING DIODE ARRAY INCLUDING APERTURES, LINE PRINTER HEAD, AND METHOD OF MANUFACTURING THE LIGHT EMITTING DIODE ARRAY

CROSS-REFERENCE TO RELATED APPLICATIONS

This application claims the benefit of Korean Patent Application No. 10-2009-100771, filed on Oct. 22, 2009, in the Korean Intellectual Property Office, the disclosure of which is incorporated herein in its entirety by reference.

BACKGROUND

1. Field

The present embodiments relate to a light emitting diode array including apertures, a line printer head using the light emitting diode array, and a method of manufacturing the light emitting diode array.

2. Description of the Related Art

Light emitting diodes are a PN junction of compound semiconductors that emit light upon receiving a current. Unlike other light sources which use a filament, a light emitting diode does not have the problem of a short circuit caused by oxidization or heating. Also, the light emitting diode is an environmentally friendly device that has a long lifespan and is driven with low power consumption. In addition, the light emitting diode has a high response speed of simultaneously responding to an applied current, has excellent durability against temperature and shocks, and is manufactured in a batch process of semiconductor manufacturing process, and thus may be easily made compact and integrated.

With the commercialization of blue light emitting diodes, natural colors can be realized, and thus a light emitting diode is widely used not only in simple display devices that have been used in the past but also in backlight units (BLU) of mobile phones, flat panel displays, outdoor electric signs, gauge boards for cars, taillights, traffic signals, lightscape lights, etc., and also in the environment field or biotechnology in which water pollution or oxygen density in blood is measured. Furthermore, due to improved product performance and reduced manufacturing costs, the application fields of light emitting diodes have gradually extended, and thus the light emitting diodes are also used as an alternative illumination to, for example, fluorescent lamps for home use. Recently, as electrophotographic image forming apparatuses have high speed and high image quality, a line printer head (LPH) that uses a light emitting diode as a light source in order to overcome the limits of a laser scanning unit (LSU), which is a conventional exposure apparatus, has been developed. The LPH includes thousands of light emitting diodes arranged at intervals of several tens of μm, and each of the light emitting diodes changes light energy according to printing image data to transmit the printing image data to a photosensitive body that is disposed at a distance of several mm away from the light emitting diodes. In a conventional LPH, an optical system, which prevents light emitted from adjacent light emitting diodes from overlapping, is further included.

SUMMARY

The present embodiments provide a light emitting diode array including apertures and capable of preventing light interference, a line printer head including the light emitting diode array, and a method of manufacturing the light emitting diode array.

According to an aspect of the embodiments, there is provided a light emitting diode array including: an aperture substrate comprising a plurality of apertures which define light tunnels; a plurality of light emitting diodes, wherein at least one light emitting diode is disposed at an incident end of each of the apertures; and a plurality of lenses that are respectively disposed at exit ends of the plurality of apertures, wherein light that is emitted from the plurality of light emitting diodes and proceeds through the plurality of apertures is refracted by the plurality of lenses.

The aperture substrate may be a growth substrate on which the plurality of light emitting diodes are formed by epitaxy.

The aperture substrate may be a substrate to which the plurality of light emitting diodes grown on a growth substrate are bonded.

The plurality of light emitting diodes may be compound semiconductors that are separated from the growth substrate and bonded to the aperture substrate.

Each of the plurality of light emitting diodes may include: a first conductivity compound semiconductor layer that is bonded to the aperture substrate; an active layer provided on the first conductivity compound semiconductor layer; and a second conductivity compound semiconductor layer provided on the active layer.

Each of the plurality of light emitting diodes includes: a first electrode layer provided on a portion of the first conductivity compound semiconductor layer; and a second electrode layer provided on the second conductivity compound semiconductor layer, wherein the second electrode layer covers a portion of the light emitting diode except a portion where the first electrode layer is formed, and an insulation layer is interposed between the second electrode layer and the second conductivity compound semiconductor layer, the active layer and the first conductivity compound semiconductor layer except for an area where the second electrode layer contacts a top surface of the second conductivity compound semiconductor layer.

A reflection layer may be inserted into the second conductivity compound semiconductor layer.

Each of the plurality of light emitting diodes may have a shape of a truncated inverted pyramid.

The light emitting diode array may further include a wiring circuit formed between the light emitting diodes and an incident surface of the aperture substrate, wherein the plurality of light emitting diodes are bonded to the wiring circuit by flip-chip bonding.

The aperture substrate may be an integrated circuit (IC) substrate to drive the light emitting diodes.

The plurality of light emitting diodes may be compound semiconductors that are separated from the growth substrate and then bonded to the aperture substrate.

The plurality of light emitting diodes may be grown on a separate growth substrate and then bonded to the aperture substrate by flip-chip bonding.

The aperture substrate may be a printed circuit board (PCB).

The plurality of apertures may each be a light tunnel that connects an incident surface and an exit surface of the aperture substrate.

The plurality of apertures respectively at the exit end may have a cross-section that is the same as or larger than a cross-section of the plurality of apertures at the incident end.

The plurality of apertures may be holes or filled with a transparent material.

An outer wall of the plurality of apertures may be formed of a reflective material or a light-absorbing material.

A portion of the incident surface of the aperture substrate where the plurality of the light emitting diodes are not disposed may be covered by a reflection layer.

The plurality of light emitting diodes may be arranged in a row or a plurality of rows.

The plurality of light emitting diodes and the plurality of lenses may be arranged such that spots of light beams emitted from the plurality of light emitting diodes and formed as an image on an image plane are at equivalent distances.

The plurality of lenses may have a refractive power as a surface of each of the lenses is curved.

The plurality of lenses may include a transparent lens layer having a refractive power as the density of impurities at the exit end of the plurality of apertures is differentiated.

According to another aspect, there is provided a line printer head comprising the above-described light emitting diode array emitting light to expose a photoreceptor in a main scanning direction.

According to another aspect, there is provided an electrophotographic image forming apparatus including: a photosensitive body; the above-described line printer head for scanning light onto a scanning surface of the photosensitive body to form an electrostatic latent image; and a developing unit for supplying toner to the electrostatic latent image formed on the photosensitive body to develop the image.

According to another aspect of the present general inventive concept, there is provided a method of manufacturing a light emitting diode array, the method including: providing a plurality of light emitting diodes on an upper surface of a main substrate; forming a plurality of apertures in the main substrate to respectively correspond to positions of the plurality of light emitting diodes; and providing a plurality of lenses on a rear surface of the main substrate to respectively correspond to positions of the apertures.

The main substrate may be a growth substrate on which the plurality of light emitting diodes are formed by epitaxy.

The providing of a plurality of light emitting diodes on an upper surface of the main substrate may include: growing a light emitting diode layer on a separate growth substrate; bonding the light emitting diode layer to the main substrate; and patterning the light emitting diode layer and forming an electrode to separate the light emitting diode layer into a plurality of light emitting diodes.

The bonding the light emitting diode layer to the main substrate may include: separating the light emitting diode layer from the growth substrate; and bonding the separated light emitting diode layer to the main substrate.

The growing of a light emitting diode layer may further include forming a separation layer between the growth substrate and the light emitting diode layer, wherein in the separating of the light emitting diode layer from the growth substrate, the separation layer is selectively etched to separate the light emitting diode layer from the growth substrate.

The bonding of the light emitting diode layer to the main substrate: bonding an upper surface of the light emitting diode layer to the main substrate; and separating the growth substrate from the light emitting diode layer.

In the separating of the growth substrate from the light emitting diode layer, the growth substrate may be removed from the light emitting diode layer by selectively etching the whole growth substrate.

The growing of the light emitting diode layer may further include forming an etching stopper layer between the growth substrate and the light emitting diode layer.

The growing of the light emitting diode layer may further include forming a separation layer between the growth substrate and the light emitting diode layer, and in the separating of the growth substrate from the light emitting diode layer, the separation layer is selectively etched to separate the growth substrate and the light emitting diode layer.

The method may further include providing a wiring circuit on an upper surface of the main substrate, wherein in the bonding of the light emitting diode layer to the main substrate, an upper surface of the light emitting diode layer is bonded to the main substrate by flip-chip bonding.

The bonding of the light emitting diode layer to the main substrate may be transferring a plurality of light emitting diode layers onto the main substrate.

The main substrate may be a large-surface glass substrate.

The main substrate may be an integrated circuit (IC) substrate to drive the plurality of light emitting diodes.

The main substrate may be a silicon substrate.

The main substrate may be a printed circuit board (PCB), and the providing of a plurality of light emitting diodes include: forming a plurality of light emitting diodes on a growth substrate; separating the plurality of light emitting diodes from one another; and mounting the plurality of light emitting diodes that are separated on the main substrate.

The providing of the lenses may include: forming a plurality of lenses on a transparent substrate; and arranging the plurality of lenses to respectively correspond to exit ends of the plurality of apertures, and bonding the transparent substrate to a rear surface of the main substrate.

The providing of a plurality of lenses may include: bonding a transparent substrate to a rear surface of the main substrate; and forming a plurality of lenses on the transparent substrate to respectively correspond to exit ends of the plurality of apertures.

The plurality of lenses of the transparent substrate may be formed using a fusion molding method, a photolithography method, an imprinting method, or an impurity diffusion method.

In the bonding, the transparent substrate and the light emitting diode layer may be bonded to each other using a spin on glass (SOG) method.

The forming of a plurality of apertures may include forming a plurality of holes in a rear surface of the main substrate to respectively correspond to positions where the plurality of light emitting diodes are formed.

In the forming of a plurality of holes, a cross-section of the holes at the rear surface of the main substrate may be the same as or greater than a cross-section of the holes at the upper surface of the main substrate.

The plurality of holes may be formed using a chemical etching method or a physical etching method.

The forming of a plurality of apertures may further include filling the holes of the main substrate with a transparent material.

BRIEF DESCRIPTION OF THE DRAWINGS

The above and other features and advantages of the present embodiments become more apparent by describing in detail the embodiments thereof with reference to the attached drawings in which.

DETAILED DESCRIPTION

Figure 1:
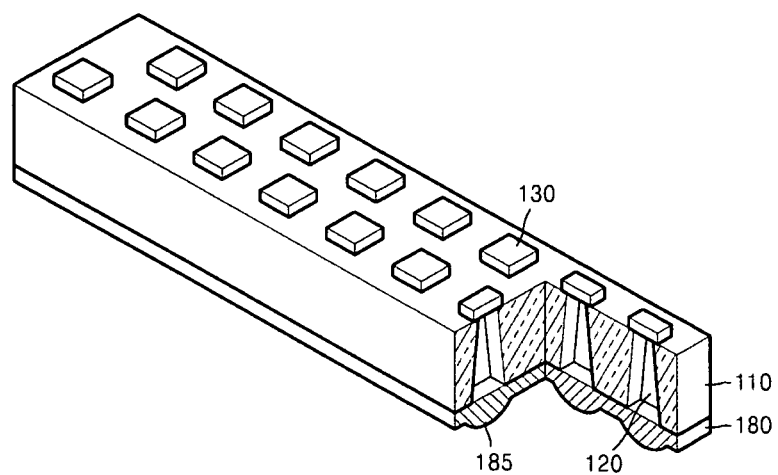
FIG. 1 is a perspective view illustrating a light emitting diode array according to an embodiment.

The present embodiments will now be described more fully with reference to the accompanying drawings, in which the embodiments are shown. The present embodiments may, however, be embodied in many different forms, and should not be construed as being limited to the embodiments set forth herein; rather, these embodiments are provided so that this disclosure will be thorough and complete, and will fully convey the concept of the embodiments to those of ordinary skill in the art. Like reference numerals denote like elements throughout the specification.

Figure 2:
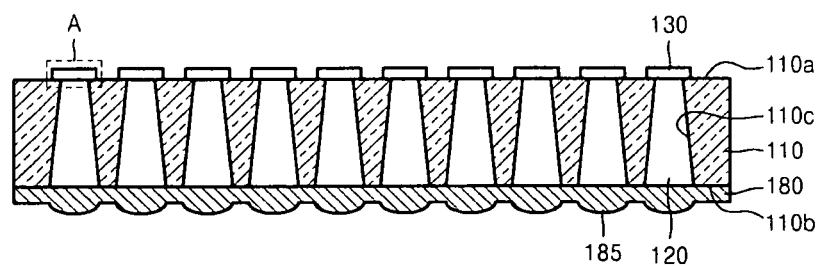
FIG. 2 is a lengthwise cross-sectional view of the light emitting diode array of FIG. 1.

FIG. 1 is a perspective view illustrating a light emitting diode array according to an embodiment. FIG. 2 is a lengthwise cross-sectional view of the light emitting diode array of FIG. 1.

Referring to FIGS. 1 and 2, the light emitting diode array includes an aperture substrate 110, a plurality of light emitting diodes 130 formed on an incident surface 110a of the aperture substrate 110, and a lens layer 180 formed on an exit surface 110b of the aperture substrate 110.

The aperture substrate 110 includes a plurality of apertures 120 as optical tunnels. A body of the aperture substrate 110 may be a growth substrate or a separate growth substrate. A growth substrate is a crystalline substrate on which the light emitting diodes 130 are formed by epitaxy, and may be, for example, a GaAs substrate or a GaN substrate. The separate substrate may be a substrate to which the light emitting diodes 130, which are formed by epitaxy on the growth substrate, are bonded, and may be formed of a transparent material such as glass, sapphire, GaP, plastic, or the like.

The incident surface 110a and the exit surface 110b of the aperture substrate 110 may be flat and parallel to each other. The incident surface 110a and the exit surface 110b may be inclined with respect to each other may have a shape such as a circle, for example. For example, if the light emitting diode array according to the embodiment of FIG. 1 is used as a line printer head, the aperture substrate 110 may have a long rectangular parallelepiped shape.

The apertures 120 are optical tunnels that connect the incident surface 110a and the exit surface 110b of the aperture substrate 110. A cross-section of the apertures 120 may be a circle or a polygon. Also, a cross-section of an exit end of each of the apertures 120 may be the same as or larger than a cross-section of an incident end of each of the apertures 120. For example, a cross-section of the apertures 120 may be uniform with respect to a depth direction of the aperture substrate 110 (or may increase in a direction from the incident surface 110a toward the exit surface 110b). The incident end of the apertures 120 refers to an end portion of the apertures 120 at the incident surface 110a of the aperture substrate 110, and the exit end of the apertures 120 refers to an end portion of the apertures 120 at the exit surface 110b of the aperture substrate 110. The apertures 120 may be holes 110c formed through the aperture substrate 110 or holes 110c filled with a transparent material. If the aperture substrate 110 is formed of a transparent material, an outer wall of the apertures 120 may be formed of a reflective material or a light-absorbing material.

According to another embodiment, at least one light emitting diode 130 is arranged on the incident end of each of the apertures 120. Referring to FIGS. 1 and 2, the plurality of apertures 120 and the plurality of light emitting diodes 130 are arranged in a one-to-one correspondence to each other. However, the embodiment of the present general inventive concept is not limited thereto. For example, according to another embodiment, as stated above, one or more of the light emitting diodes 130 may be arranged on one aperture 120. A lens 185 is disposed on the exit end of each of the apertures 120.

Figure 3:
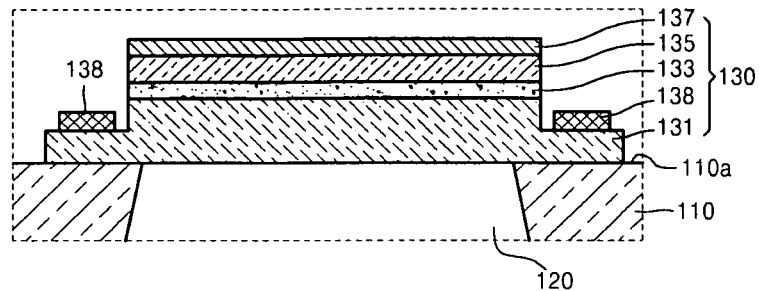
FIG. 3 is an enlarged view of a portion A of the light emitting diode array of FIG. 2.

The plurality of light emitting diodes 130 are formed on the incident surface 110a of the aperture substrate 110 to respectively correspond to the apertures 120. A configuration of each of the light emitting diodes 130 will be described with reference to FIG. 3. FIG. 3 is an enlarged view of a portion A of the light emitting diode array of FIG. 2. Referring to FIG. 3, the plurality of light emitting diodes 130 each include a first conductive compound semiconductor layer 131 that is formed in an area where the aperture 120 of the aperture substrate 110 is formed, an active layer 133 formed on the first conductivity compound semiconductor layer 131, a second conductivity compound semiconductor layer 135 formed on the active layer 133, a first electrode layer 138 formed on a portion of the first conductivity compound semiconductor layer 131, and a second electrode layer 137 formed on the second conductivity compound semiconductor layer 135. The first and second electrode layers 138 and 137 are in ohmic contact with the first and second conductivity compound semiconductor layers 131 and 135, respectively, to supply electrons or holes, and may be formed of a metal having good conductivity. For example, the first and second electrode layers 138 and 137 may be formed of a single material layer such as Au, Ni, Ti, Al, or the like, or a double layer structure formed of Au, Ni, Ti, Al, or the like. When the aperture substrate 110 is formed of a conductive material such as GaP, the aperture substrate 110 may function as an electrode for the first conductivity compound semiconductor layer 131, instead of the first electrode layer 138. The second electrode layer 137 may cover an upper portion of the second conductivity compound semiconductor layer 135 so as to function as a reflection layer with respect to light emitted from the active layer 133.

The first conductivity compound semiconductor layer 131, the active layer 133, and the second conductivity compound semiconductor layer 135 are epitaxial layers which are formed by epitaxy. The first conductivity compound semiconductor layer 131 may be formed of, for example, an N-doped compound semiconductor, and the second conductivity compound semiconductor layer 135 may be formed of, for example, a P-doped compound semiconductor, or vice versa. The active layer 133 may be formed of a P-doped, N-doped, or non-doped compound semiconductor, and may have a single quantum well structure or a multiple quantum well structure. Holes or electrons supplied from the first and second conductivity compound semiconductor layers 131 and 135 recombine in the active layer 133, thereby emitting light.

Due to lattice mismatch, the selection of a substrate on which the epitaxial layer is grown is limited. The epitaxial layer may be a compound semiconductor that is formed by epitaxy on a GaAs substrate and that emits red light; in detail, the epitaxial layer may be a GaAsP, AlGaAs, InGaP, or InGaAlP compound semiconductor. The GaAs substrate is an opaque substrate to red light, and may be used as the body of the aperture substrate 110. Meanwhile, the GaAs substrate is a crystalline substrate that is difficult to manufacture in a large-size. Accordingly, an epitaxial layer is grown on the GaAs substrate, and only the epitaxial layer is transferred to another large-sized aperture substrate 110 to manufacture a large-sized light emitting diode array. Alternatively, only the epitaxial layer may be transferred to an integrated circuit substrate for driving a light emitting diode, such as a silicon substrate.

Referring to FIGS. 1 and 2 again, the plurality of light emitting diodes 130 are arranged in two rows on the aperture substrate 110. The plurality of light emitting diodes 130 of the first and second rows may be arranged in a zigzag pattern as seen from above. Accordingly, the plurality of light emitting diodes 130 may be densely arranged. In FIG. 1, two rows of the plurality of light emitting diodes 130 are arranged, but the embodiments are not limited thereto. For example, the plurality of light emitting diodes 130 may be arranged in one row or three or more rows. When the plurality of light emitting diodes 130 are in three or more rows, the plurality of light emitting diodes 130 of the three or more rows may be arranged in a zigzag pattern so as not to overlap one another.

The lens layer 180 is formed of a transparent material, includes the lenses 185, and is attached on the exit surface 110b of the aperture substrate 110. According to the embodiment of FIG. 1, the lenses 185 and the apertures 120 are arranged in a one-to-one correspondence with each other but the embodiments are not limited thereto. For example, according to another embodiment, at least one of the lenses 185 may be arranged on each of the apertures 120.

The plurality of lenses 185 may be formed by molding a surface of the lens layer 180 corresponding to the apertures 120, into a curved surface. Alternatively, impurities may be diffused to positions on the lens layer 180 corresponding to the apertures 120 so as to locally modulate a refractive index of the lens layer 180 so that the lens layer 180 partially has refractive power and thus functions as the lenses 185.

The plurality of light emitting diodes 130 and the lenses 185 may be arranged and designed such that spots of light beams that are emitted from the plurality of light emitting diodes 130 and formed on an image plane are at equivalent distances in the arrangement direction of the plurality of light emitting diodes 130.

Also, a portion of the incident surface 110a of the aperture substrate 110 where the plurality of light emitting diodes 130 are not formed may be covered with a reflection layer (not shown). The reflection layer allows light emitted from the plurality of light emitting diodes 130 to proceed toward the exit surface 110b of the aperture substrate 110, thereby increasing light extraction efficiency.

In the light emitting diode array according to the embodiment of FIG. 1, as the apertures 120 are formed in the aperture substrate 110, light emitted from each of the plurality of light emitting diodes 130 may be transmitted to the lenses 185 without crossing one another. Thus, crosstalk between the plurality of light emitting diodes 130 that may be generated while the light transmits through the aperture substrate 110 may be prevented. Also, in the light emitting diode array according to the embodiment of FIG. 1, as the lenses 185 are formed on the aperture substrate 110, light may be focused without using an additional optical unit and may be emitted. Thus, a compact device having a simple optical configuration may be implemented in application devices. Also, in the light emitting diode array according to the embodiment of FIG. 1, the lenses 185 are disposed directly on the aperture substrate 110, and thus a distance between the lenses 185 and the plurality of light emitting diodes 130 is small and uniform. Accordingly, light extraction efficiency may be increased and uniformity of light may be maintained.

Figure 4A:
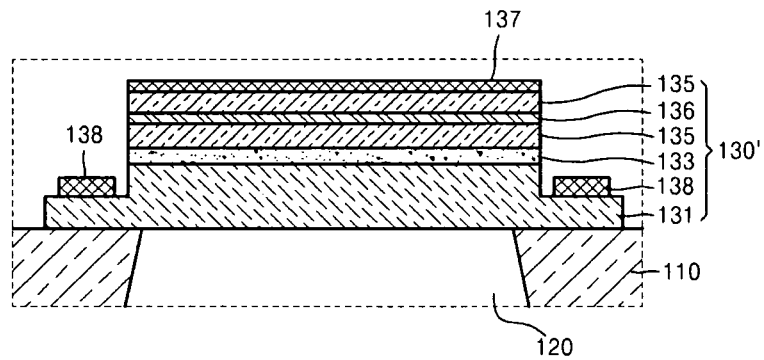
FIGS. 4A through 4C illustrate light emitting diodes used in a light emitting diode array, according to other embodiments.

FIG. 4A illustrates a light emitting diode 130' used in light emitting diode array, according to another embodiment.

Referring to FIG. 4A, the light emitting diode 130' includes a first conductivity compound semiconductor layer 131 bonded to an aperture substrate 110, an active layer 133 formed on the first conductivity compound semiconductor layer 131, a second conductivity compound semiconductor layer 135 formed on the active layer 133, a reflection layer 136 formed on the second conductivity compound semiconductor layer 135, another second conductivity compound semiconductor layer 135 formed on the reflection layer 136, a first electrode layer 138 formed on a portion of the first conductivity compound semiconductor layer 131, and a second electrode layer 137 formed on the other second conductivity compound semiconductor layer 135. The light emitting diode 130' is substantially the same as the light emitting diode 130 of FIG. 3 except that the reflection layer 136 is further included on the second conductivity compound semiconductor layer 135, and the other second conductivity compound semiconductor layer 135 is formed on the reflection layer 136.

The reflection layer 136 reflects light that proceeds upward among light isotropically emitted from the active layer 133, toward the aperture substrate 110, thereby increasing the light extraction efficiency. The reflection layer 136 may be a distributed Bragg reflector (DBR) layer that is formed by alternately stacking materials having different refractive indices. A DBR layer is well known in the art, and thus description thereof will be omitted. Referring to FIG. 4A, the reflection layer 136 is inserted into the second conductivity compound semiconductor layer 135, but is not limited thereto; the reflection layer 136 may be formed on an upper surface of the second conductivity compound semiconductor layer 135.

Figure 4B:
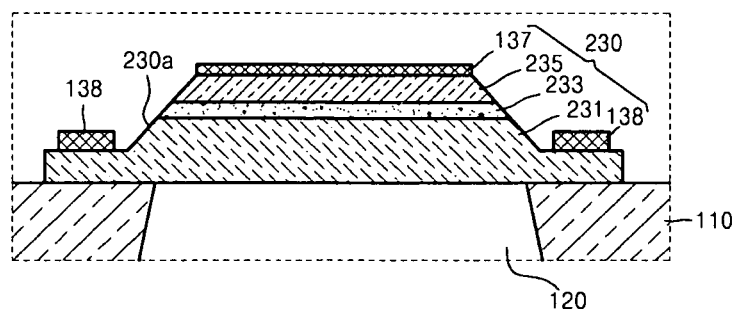

FIG. 4B illustrates a light emitting diode 230 used in a light emitting diode array, according to another embodiment.

Referring to FIG. 4B, the light emitting diode 230 includes a first conductivity compound semiconductor layer 231 bonded to an aperture substrate 110, an active layer 233 formed on the first conductivity compound semiconductor layer 231, a second conductivity compound semiconductor layer 235 formed on the active layer 233, a first electrode layer 138 formed on a portion of the first conductivity compound semiconductor layer 231, and a second electrode layer 137 formed on the second conductivity compound semiconductor layer 235.

The light emitting diode 230 has an inclined surface 230a having a shape of a truncated inverted pyramid. The inclined surface 230a reflects light emitted from the active layer 233 to the aperture substrate 110, thereby increasing the light extraction efficiency. According to the embodiment of FIGS. 4A-4B, the light emitting diode 230 has a shape of a truncated inverted pyramid; however the embodiment is not limited thereto, and the light emitting diode 230 may have various shapes to improve light extraction efficiency. The light emitting diode 230 is substantially the same as the light emitting diode 130 of FIG. 3 except for the truncated inverted pyramid shape of the light emitting diode 230.

Figure 4C:
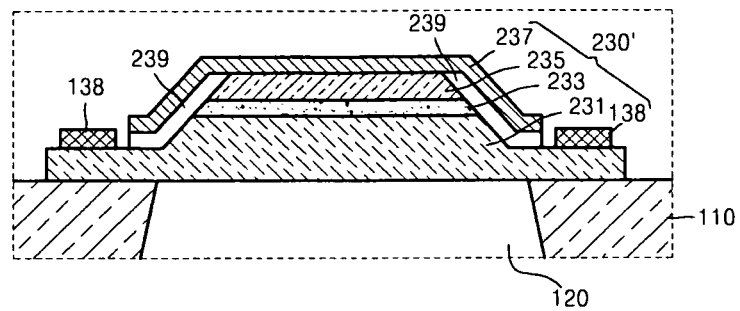

FIG. 4C illustrates a light emitting diode 230' used in a light emitting diode array, according to another embodiment.

Referring to FIG. 4C, the light emitting diode 230' includes a first conductivity compound semiconductor layer 231 bonded to an aperture substrate 110, an active layer 233 formed on the first conductivity compound semiconductor layer 231, a second conductivity compound semiconductor layer 235 formed on the active layer 233, a first electrode layer 138 formed on a portion of the first conductivity compound semiconductor layer 231, and a second electrode layer 237 that substantially covers a portion of the light emitting diode 230' except a portion where the first electrode 138 is formed, and an insulation layer 239 interposed between the second electrode layer 237 and the second conductivity compound semiconductor layer 235, the active layer 233, and the first conductivity compound semiconductor layer 231 except for an area where the second electrode 237 contacts a top surface of the second conductivity compound semiconductor layer 235 in the area of the light emitting diode 230' covered by the second electrode layer 237. The light emitting diode 230' is substantially the same as the light emitting diode 230 of FIG. 4B except that the second electrode layer 237 substantially covers a portion of the light emitting diode 230', including an inclined surface of the light emitting diode 230', and the insulation layer 239.

As the second electrode layer 237 substantially covers a portion of the light emitting diode 230' except for the area where the first electrode 138 is formed, light emitted from the active layer 233 is reflected by the second electrode layer 237 and proceeds toward the aperture substrate 110, thereby increasing the light extraction efficiency. To this end, the second electrode layer 237 may be formed of a metal having good reflection characteristics, and may have a sufficient thickness so that light is not transmitted therethrough.

Figure 5:
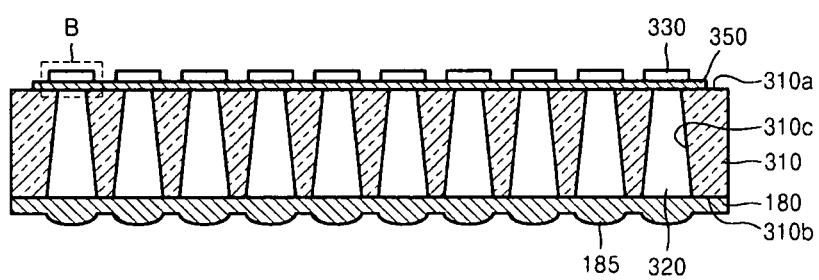
FIG. 5 is a lengthwise cross-sectional view of a light emitting diode array, according to another embodiment.
Figure 6:
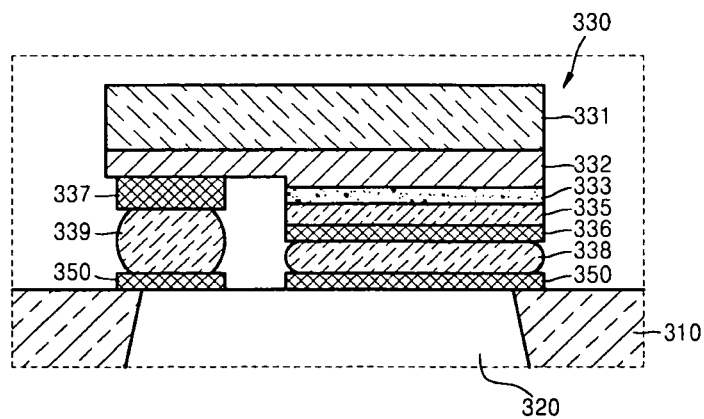
FIG. 6 is an enlarged view of a portion B of the light emitting diode array of FIG. 5.

FIG. 5 is a lengthwise cross-sectional view of a light emitting diode array, according to another embodiment. FIG. 6 is an enlarged view of a portion B of the light emitting diode array of FIG. 5.

Referring to FIG. 5, the light emitting diode array includes an aperture substrate 310, a wiring circuit 350 provided on an incident surface 310a of the aperture substrate 310, a plurality of light emitting diodes 330 provided on the wiring circuit 350, and a lens layer 180 provided on an exit surface 310b of the aperture substrate 310.

The aperture substrate 310 includes a plurality of apertures 320. The aperture substrate 310 is a separate growth substrate that is different from a substrate on which the plurality of light emitting diodes 330 are formed by epitaxy. For example, the aperture substrate 310 may be a glass substrate on which a driving circuit to drive the light emitting diodes 330 is formed, or a silicon substrate on which an integrated circuit (IC) to drive the light emitting diodes 330 is integrated. Furthermore, the aperture substrate 310 may be a typical printed circuit board (PCB). The wiring circuit 350 may be, for example, a simple wiring circuit to supply power to the light emitting diodes 330, a driving circuit to drive the light emitting diodes 330, or an IC on which a LED driving circuit is integrated.

Referring to FIG. 6, the light emitting diodes 330 each include a first conductivity compound semiconductor layer 332 that is formed on a growth substrate 331 by epitaxy, an active layer 333 formed on the first conductivity compound semiconductor layer 332, a second conductivity compound semiconductor layer 335 formed on the active layer 333, a first electrode layer 337 formed on a portion of the first conductivity compound semiconductor layer 332, and a second electrode layer 336 formed on the second conductivity compound semiconductor layer 335, which are bonded to the aperture substrate 310 by flip-chip bonding. Meanwhile, the wiring circuit 350 for flip chip-bonding of the light emitting diode 330 may be disposed on the aperture substrate 310. Also, solders 338 and 339 for flip-chip bonding are included. In FIG. 6, only the flip-chip bonded portions are illustrated, and a light tunnel from the active layer 333 toward the aperture substrate 310 which is not flip-chip bonded is not illustrated. Also, in FIG. 6, only one light emitting diode that is flip-chip bonded is illustrated but the flip-chip bonding may also be performed for the plurality of light emitting diodes 330 by each wafer unit. The light emitting diode 330 according to the embodiment of FIG. 6 is flip-chip bonded to the aperture substrate 310 by flip-chip bonding, and thus there is no need to remove the growth substrate, such as GaAs, used for epitaxy of the light emitting diode 330.

The flip-chip bonding is an example of bonding the light emitting diodes 330 to the aperture substrate 310 but the method of bonding is not limited thereto. For example, an epitaxial layer of a compound semiconductor, which is a main material of the light emitting diodes 330, may be transferred onto the aperture substrate 310 and then the light emitting diodes 330 and the wiring circuit 350 may be respectively manufactured using a typical semiconductor process.

The apertures 320 are light tunnels that connect the incident surface 310a and the exit surface 310c of the aperture substrate 310, and are substantially the same as the apertures 120 of the embodiment described with reference to FIG. 1. Also, the lens layer 180 is formed on the exit surface 310c of the aperture substrate 310 and is substantially the same as the lens layer 180 described with reference to the embodiment of FIG. 1. A hole 310b converts the surfaces 310a and 310c Next, a method of manufacturing a light emitting diode, according to an embodiment.

FIGS. 7A through 7F illustrate a method of manufacturing a light emitting diode array, according to an embodiment.

Figure 7A:
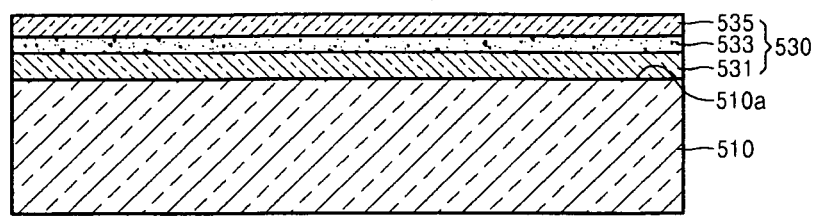
FIGS. 7A through 7F illustrate a method of manufacturing a light emitting diode array, according to an embodiment.

Referring to FIG. 7A, an epitaxial layer, that is, a light emitting diode layer 530 is grown on an upper surface 510a of a growth substrate 510. The light emitting diode layer 530 is formed by sequentially stacking a first conductivity compound semiconductor layer 531, an active layer 533, and a second conductivity compound semiconductor layer 535. The growth substrate 510 is a crystalline substrate from which the light emitting diode layer 530 may be formed, and may be, for example, a GaAs wafer, a GaP wafer, or the like. The light emitting diode layer 530 may be grown using epitaxy methods such as a metal organic chemical vapor deposition (MOCVD) method, a molecular beam epitaxy (MBE) method or a metal organic molecular beam epitaxy (MO-MBE) method.

Figure 7B:
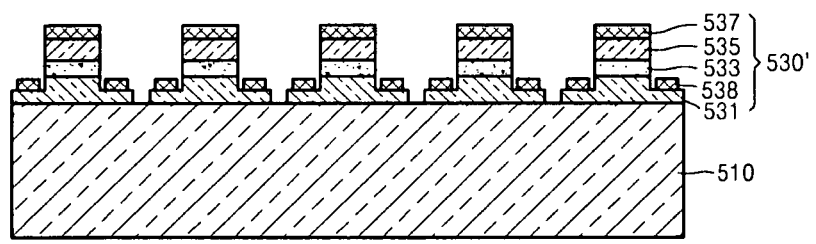

Next, referring to FIG. 7B, the light emitting diode layer 530 is patterned by using a photolithography process and is etched into a plurality of light emitting diode structures, and electrode layers 537 and 538 are formed on the light emitting diode structures of the light emitting diode layer 530 by using a metal patterning process, thereby forming a plurality of light emitting diodes 530'.

Figure 7C:
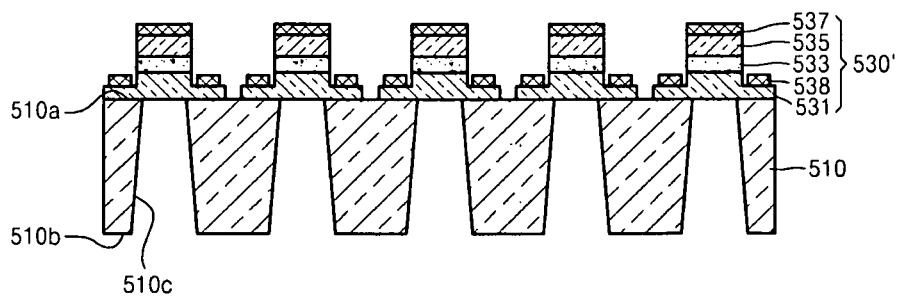

Next, referring to FIG. 7C, a plurality of holes 510c are formed in a rear surface 510b of the growth substrate 510. The plurality of holes 510c are formed correspondingly below the plurality of light emitting diodes 530'. The plurality of holes 510c are formed such that a cross-section thereof at the rear surface 510b of the growth substrate 510 is the same as or larger than that at the upper surface 510a of the growth substrate 510. The plurality of holes 510c may also be formed using a chemical etching method using, for example, plasma, an acid, a base, or the like, or a physical etching method such as a sandblasting method, a laser drilling method, etc. As described above, the plurality of holes 510c are formed directly in the growth substrate 510 so as to use the growth substrate 510 as an aperture substrate.

Figure 7D:
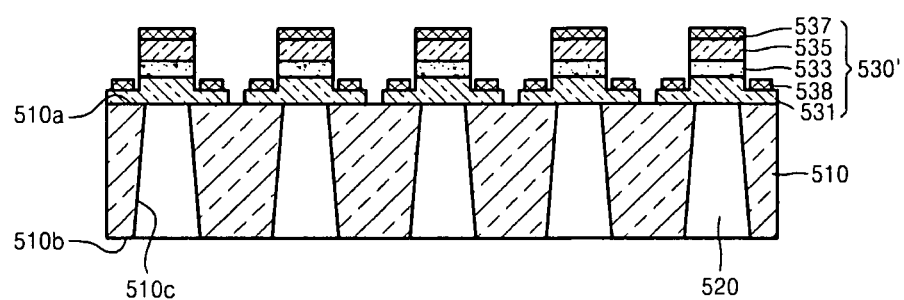

Next, referring to FIG. 7D, the plurality of holes 510c formed in the growth substrate 510 are filled with a transparent material to form apertures 520. Alternatively, the above operation may be omitted and the plurality of holes 510c may be used as the apertures 520.

Figure 7E:

Also, referring to FIG. 7E, a transparent substrate 550, on a surface of which a plurality of lenses 555 are formed, is provided. For example, the transparent substrate 550 may be formed of glass, plastic, or polymer. For example, the lenses 555 may be formed using a fusion molding method. Also, the lenses 555 may be formed on the transparent substrate 555 using a photolithography method or an imprinting method. In FIG. 7E, the lenses 555 that are formed by processing a surface of the transparent substrate 550 to have a predetermined curvature are illustrated; however the embodiment of FIGS. 7A-7F is not limited thereto. For example, flat lenses may be formed by diffusing impurities into the transparent substrate 550 to locally modulate a refractive index of the transparent substrate 550.

Figure 7F:
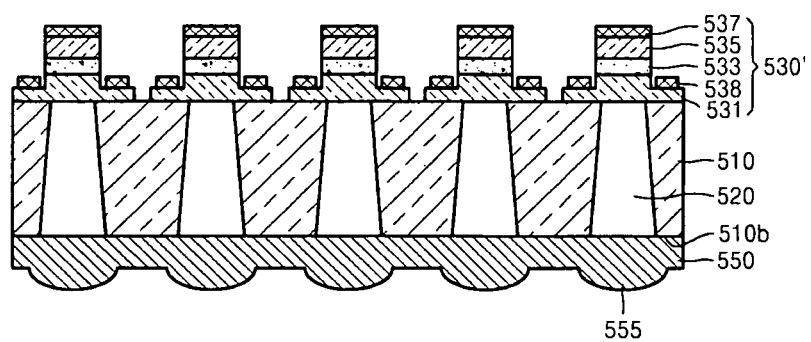

Next, referring to FIG. 7F, the transparent substrate 550 on which the lenses 555 are formed is bonded to the rear surface 510b of the growth substrate 510. The plurality of light emitting diodes 530' are positioned to respectively correspond to the lenses 555. For example, the surface bonding may be conducted by using heat and pressure. To facilitate the surface bonding, a spin on glass (SOG) may be coated on a bonding surface of the growth substrate 510 or the transparent substrate 550.

Figure 8A:
FIGS. 8A through 8C illustrate a method of manufacturing a light emitting diode array, according to another embodiment.
Figure 8B:
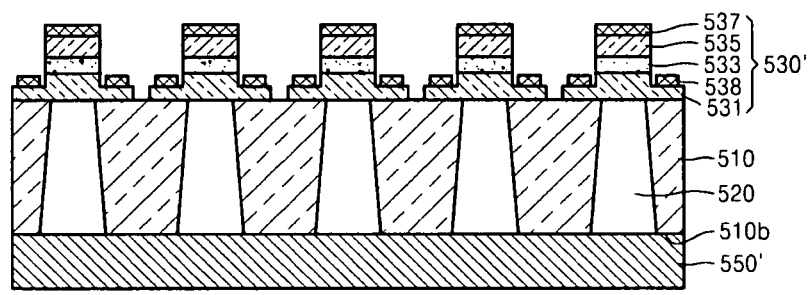
Figure 8C:
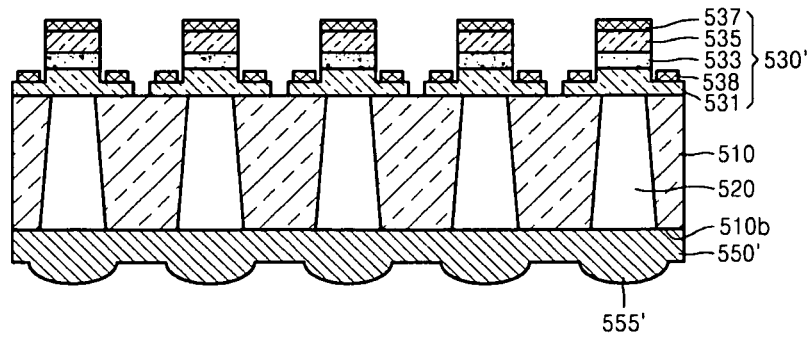

The transparent substrate 550 on which the lenses 555 are formed is bonded to the growth substrate 510; however, the embodiment is not limited thereto. For example, as illustrated in FIGS. 8A and 8B, a flat transparent substrate 550' may be bonded to a rear surface 510b of the growth substrate 510 on which the plurality of light emitting diodes 530' are formed, and then, as illustrated in FIG. 8C, lenses 555' may be formed by processing the transparent substrate 550'. Depending on the situation, a transparent polymer layer may be coated on the rear surface 510b of the growth transparent substrate 510, and then the coated polymer layer may be processed into a lens surface by using, for example, an imprinting process.

FIGS. 9A through 9I illustrate a method of manufacturing a light emitting diode array, according to another embodiment.

Figure 9A:
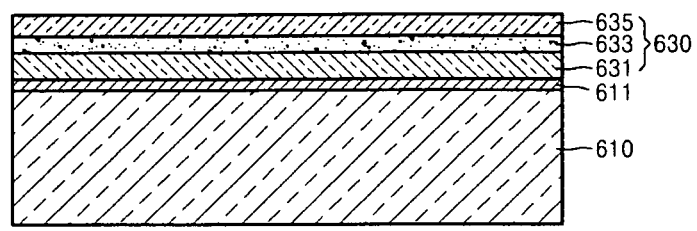
FIGS. 9A through 9I illustrate a method of manufacturing a light emitting diode array, according to another embodiment.

Referring to FIG. 9A, a separation layer 611, and an epitaxial layer, that is, a light emitting diode layer 630, are grown on a growth substrate 610 in the order stated. The light emitting diode layer 630 is formed by sequentially stacking a first conductivity compound semiconductor layer 631, an active layer 633, and a second conductivity compound semiconductor layer 635 on the separation layer 611. The separation layer 611 may be formed of a material having a high etching selectivity to the light emitting diode layer 630, for example, AlAs.

Figure 9B:
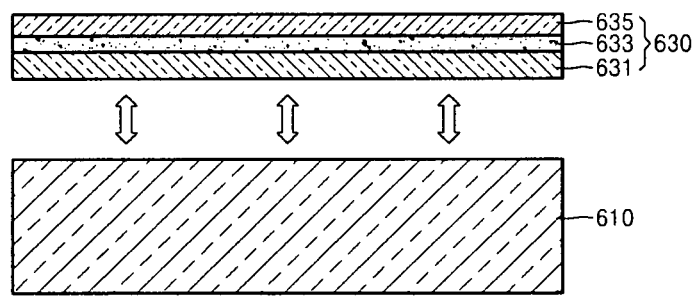

Next, referring to FIG. 9B, the separation layer 611 is removed by etching, thereby separating the light emitting diode layer 630 from the growth substrate 610. In the fabrication, the separation of the light emitting diode layer 630 from the growth substrate 610 may be conducted on each wafer unit or on a divided piece after dividing a wafer of the growth substrate 610 into multiple pieces.

Figure 9C:
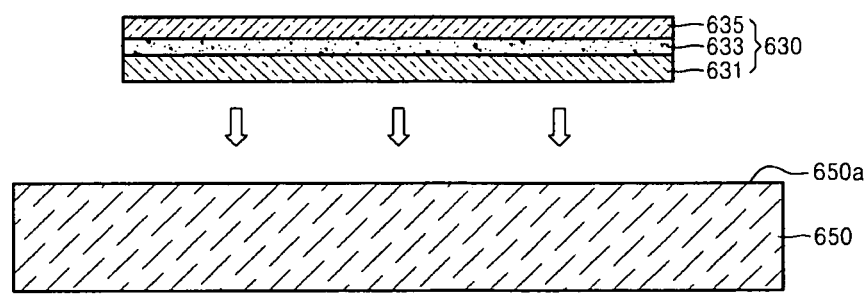
Figure 9D:
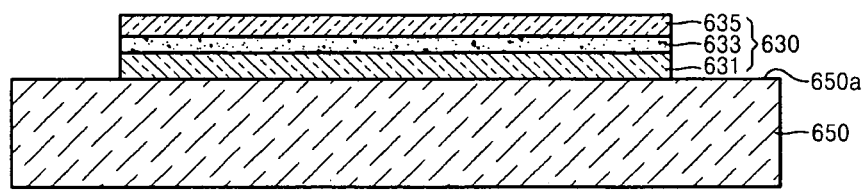

Next, referring to FIGS. 9C and 9D, the separated light emitting diode layer 630 is bonded to an upper surface 650a of a main substrate 650. The main substrate 650 is a different substrate from the growth substrate 610 on which the light emitting diode layer 630 is formed by epitaxy. The main substrate 650 may be a glass substrate in which a driving circuit for driving the light emitting diode layer 630 is formed, or a silicon substrate in which an IC for driving the light emitting diode layer 630 is integrated. The main substrate 650 is an aperture substrate in which a plurality of apertures 670 (see FIG. 9H) are formed.

Figure 9E:
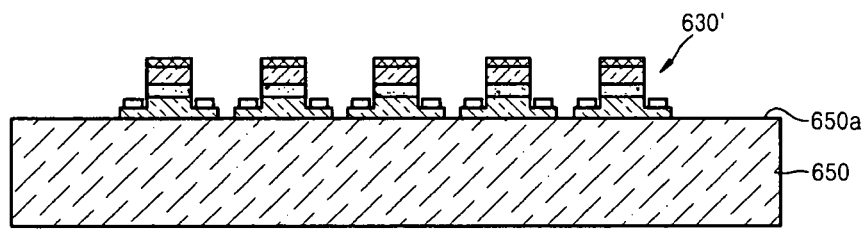
Figure 9F:
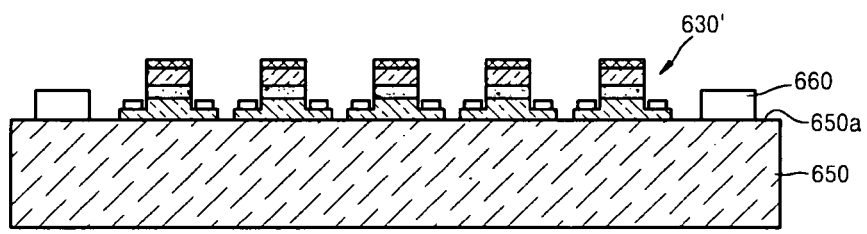

Next, referring to FIGS. 9E and 9F, a photolithography and etching process and a metal patterning process are performed to the light emitting diode layer 630 to form a plurality of light emitting diodes 630', and a semiconductor device 660 driving the light emitting diodes 630' is formed and other wiring processes also driving the light emitting diodes 630' are performed by using a typical semiconductor process.

Figure 9G:
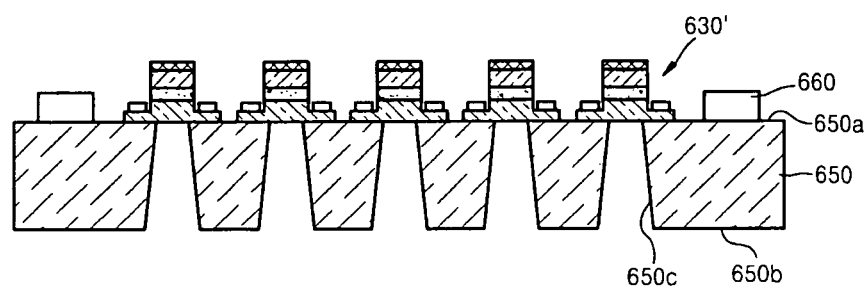
Figure 9H:
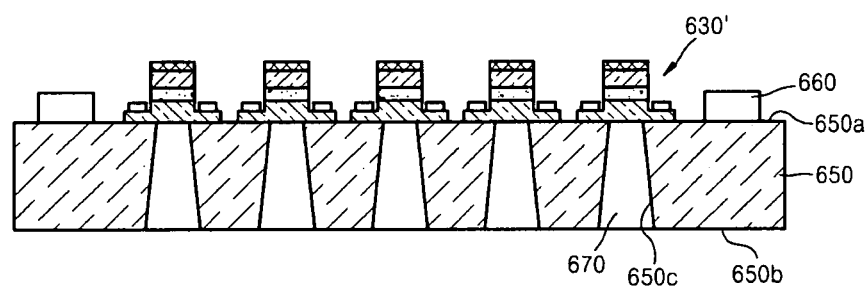

Next, referring to FIGS. 9G and 9H, a plurality of holes 650c are formed in a rear surface 650b of the main substrate 650, and a transparent material is filled in the holes 650c to form the apertures 670. The plurality of holes 650c are formed correspondingly below the plurality of light emitting diodes 630', respectively. The plurality of holes 650c may be formed using a chemical etching method or a physical etching method as described above. Alternatively, the operation of filling the plurality of holes 650c with a transparent material may be omitted and the plurality of holes 650c may be used as the apertures 670.

Figure 9I:
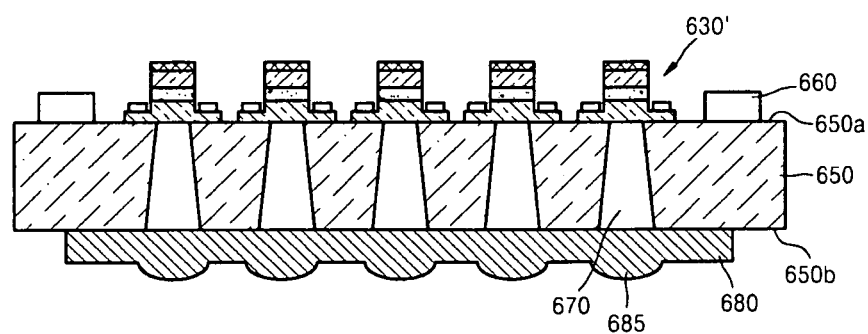

Next, referring to FIG. 9I, a transparent substrate 680 including lenses 685 is attached to the rear surface 650b of the main substrate 650. Alternatively, the lenses 685 may be molded after attaching the transparent substrate 680, which is flat before the molding, to the main substrate 650.

According to the embodiment of FIGS. 9A-9I, the light emitting diode layer 630 is separated from the growth substrate 610, and the light emitting diode layer 630 is bonded to the main substrate 650; however, the embodiment is not limited thereto.

Figure 10A:
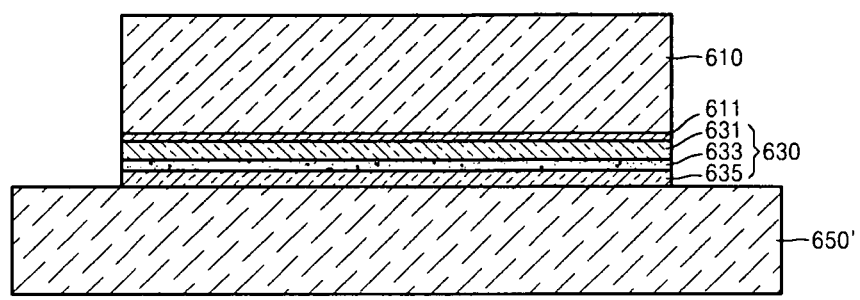
FIGS. 10A and 10B illustrate an operation of the method of manufacturing a light emitting diode array described with reference to FIGS. 9A through 9I, according to another embodiment.
Figure 10B:
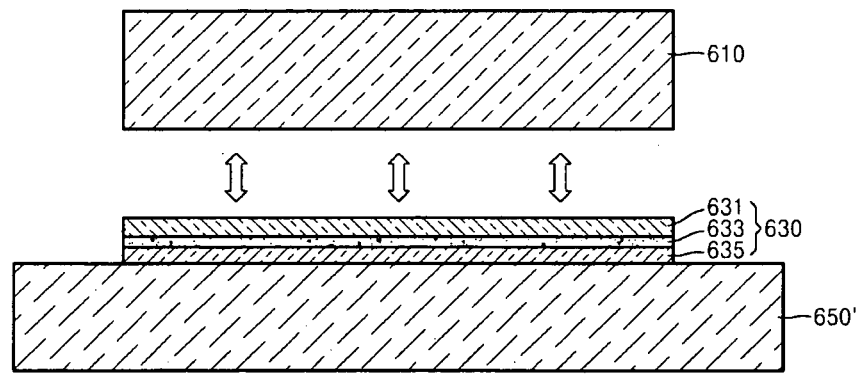

FIGS. 10A and 10B illustrate an operation of the method of manufacturing a light emitting diode array described with reference to FIGS. 9A through 9I, according to another embodiment.

Referring to FIGS. 10A and 10B, an upper surface of a light emitting diode layer 630, which is grown on a growth substrate 610, is bonded to a main substrate 650', and then the growth substrate 610 is separated from the light emitting diode layer 630. The growth substrate 610 may be separated, for example, by selectively etching the whole growth substrate 610 from the light emitting diode layer 630, and here, a separation layer 611 that is interposed between the growth substrate 610 and the light emitting diode layer 630 functions as an etching stopper layer. Alternatively, only the separation layer 611 is removed by selectively etching, thereby separating the light emitting diode layer 630 from the growth substrate 610. Here, the separation layer 611 interposed between the growth substrate 610 and the light emitting diode layer 630 functions as a sacrificial layer.

FIGS. 11A through 11G illustrate a method of manufacturing a light emitting diode array, according to another embodiment.

Figure 11A:
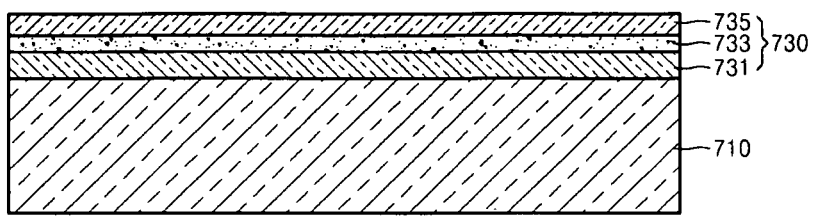
FIGS. 11A through 11G illustrate a method of manufacturing a light emitting diode array, according to another embodiment.
Figure 11B:
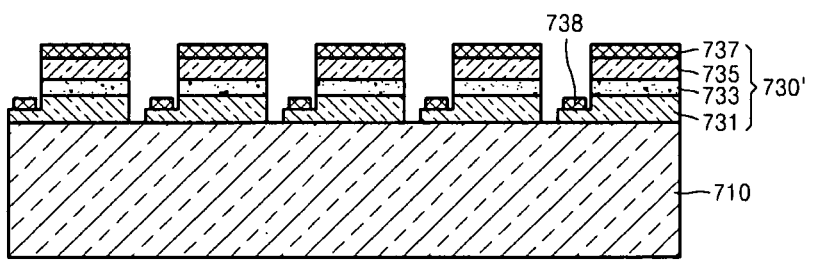

Referring to FIG. 11A, an epitaxial layer 730 is grown on a growth substrate 710. The epitaxial layer 730 is formed by sequentially stacking a first conductivity compound semiconductor layer 731, an active layer 733, and a second conductivity compound semiconductor layer 735 on the growth substrate 710. Next, referring to FIG. 11B, a photolithography process is performed to etch the epitaxial layer 730 into a plurality of light emitting diode structures, and a metal patterning process is performed to form electrode layers 737 and 738 on the light emitting diode structures of the epitaxial layer 730, thereby forming a plurality of light emitting diodes 730'. The operations are substantially the same as those of the embodiment described with reference to FIGS. 7A and 7B.

Figure 11C:
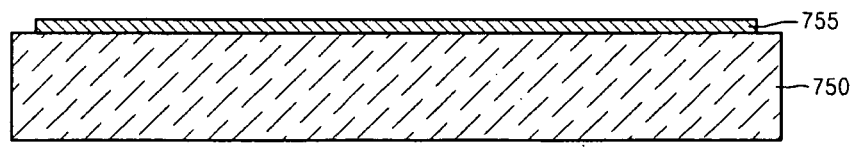

Also, referring to FIG. 11C, a main substrate 750 having an upper surface 750a on which a wiring circuit 755 is formed is provided. The main substrate 750 may be a glass substrate in which a driving circuit for driving a light emitting diode is formed, or a silicon substrate in which an IC driving a light emitting diode is integrated. Furthermore, the main substrate 750 may be a typical PCB. The wiring circuit 755 may be, for example, a simple wiring circuit supplying power to a light emitting diode or a driving circuit driving a light emitting diode, or an IC in which a driving circuit for the light emitting diode is integrated.

Figure 11D:
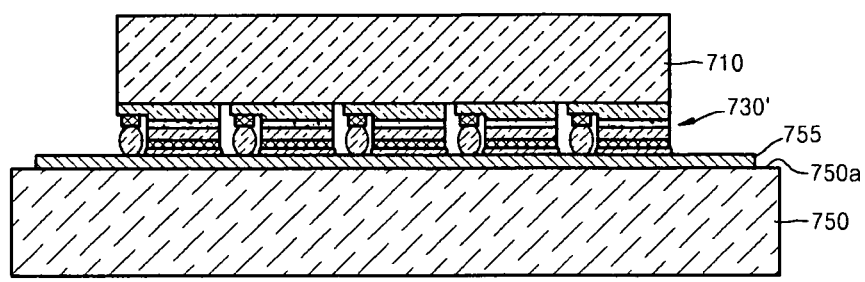

Next, referring to FIG. 11D, the plurality of light emitting diodes 730' are bonded to the main substrate 750 by flip-chip bonding. In the fabrication, the flip-chip bonding allows that the plurality of light emitting diodes 730' are bonded to the main substrate 750 for each wafer unit.

Figure 11E:
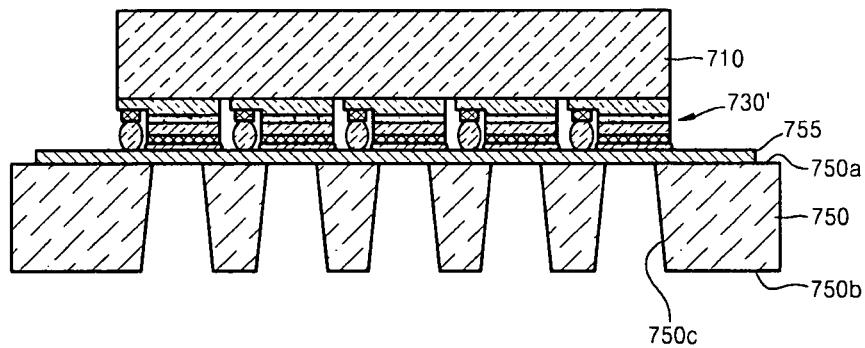
Figure 11F:
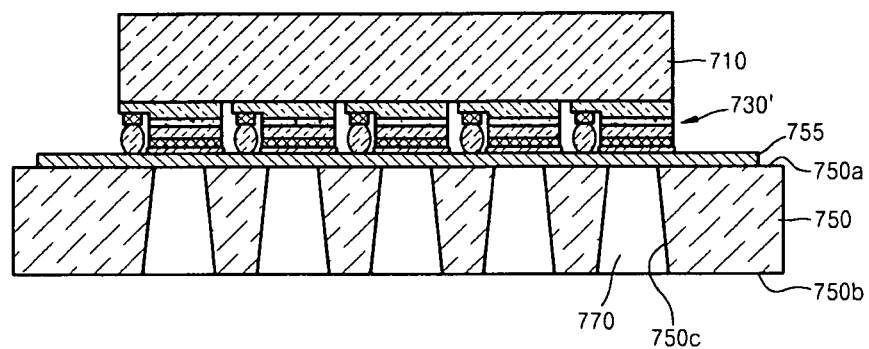

Next, referring to FIGS. 11E and 11F, a plurality of holes 750c are formed in a rear surface 750b of the main substrate 750, and a transparent material is filled in the holes 750 to form a plurality of apertures 770. Alternatively, the latter operation may be omitted and the plurality of holes 750c may be used as the apertures 770.

Figure 11G:
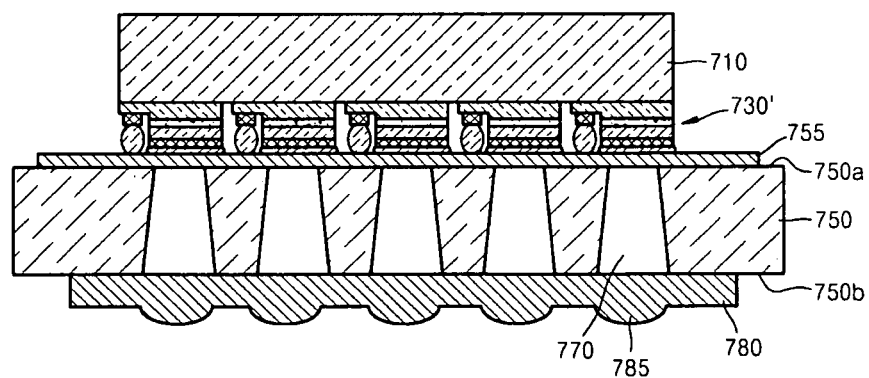

Next, referring to FIG. 11G, a transparent substrate 780 including lenses 785 is attached to the rear surface 750b of the main substrate 750. Alternatively, the lenses 785 may be molded in the transparent substrate 780 after attaching the transparent substrate 780 to the main substrate 750.

According to the embodiment of FIGS. 11A-11G, the plurality of light emitting diodes 730' are attached to the main substrate 750 by flip-chip bonding; however the embodiments is not limited thereto, and, other methods of bonding a semiconductor device to a substrate.

FIGS. 12A through 12E illustrate a method manufacturing a light emitting diode array, according to another embodiment.

Figure 12A:
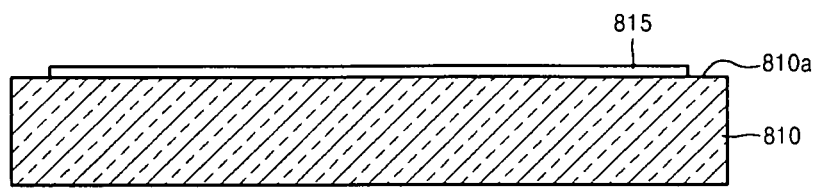
FIGS. 12A through 12E illustrate a method of manufacturing a light emitting diode array, according to another embodiment.

Referring to FIG. 12A, a main substrate 810 on which a wiring circuit 815 is formed on an upper surface 810a thereof is provided. The main substrate 810 may be, for example, a PCB.

Figure 12B:
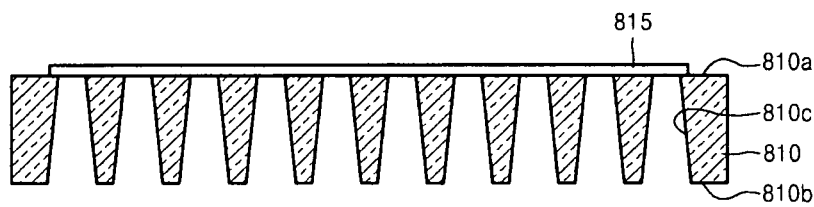
Figure 12C:
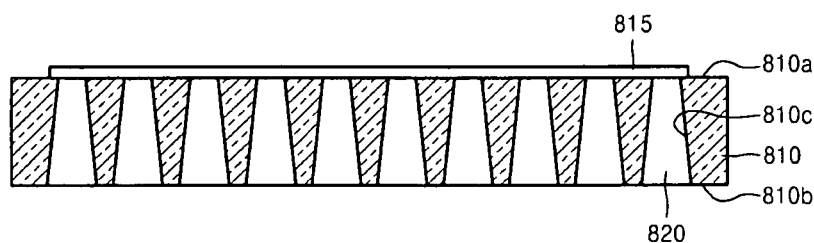

Next, referring to FIGS. 12B and 12C, a plurality of holes 810c are formed in a rear surface 810b of the main substrate 810 until a bottom surface of the wiring circuit 815 is exposed, and a transparent material is filled in the holes 810 to form a plurality of apertures 820. Alternatively, the latter operation may be omitted and the plurality of holes 810c may be used as the apertures 820.

Figure 12D:
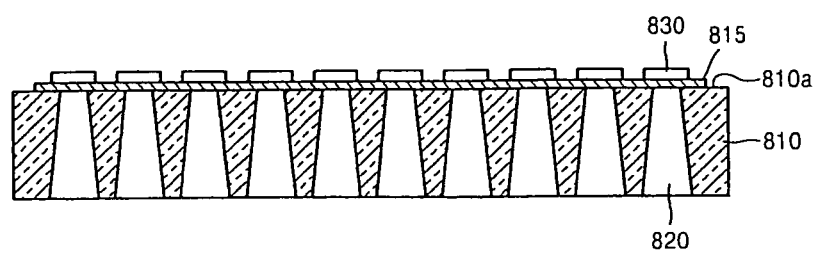

Next, referring to FIG. 12D, a plurality of light emitting diodes 830 are mounted on the upper surface 810a of the main substrate 810. The light emitting diodes 830 are arranged to respectively correspond to positions of the apertures 820, and an exit surface of the light emitting diodes 830 is directed to the apertures 820. The light emitting diodes 830 may be manufactured using a typical light emitting diode manufacturing process. Alternatively, devices other than the light emitting diodes 830 may also be mounted on the upper surface 810a of the main substrate 810.

Figure 12E:
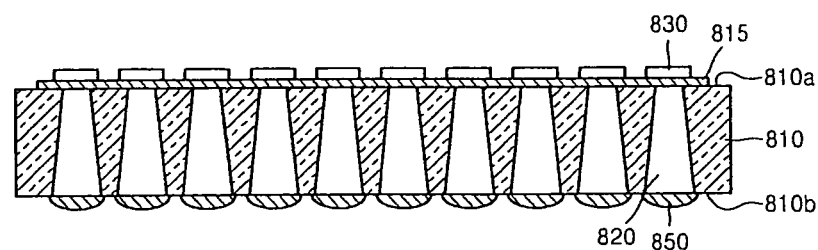

Next, referring to FIG. 12E, a plurality of lenses 850 are attached to the rear surface 810b of the main substrate 810. The lenses 850 are arranged to respectively correspond to positions where the apertures 820 are formed. Instead of attaching the lenses 850 individually, a transparent substrate (550 of FIG. 7E) including lenses may be attached to the rear surface 810b of the main substrate 810.

FIGS. 13A through 13G illustrate a method of manufacturing a light emitting diode array, according to another embodiment.

Figure 13A:
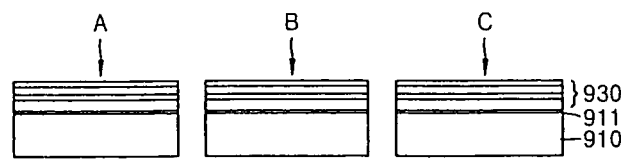
FIG. 13 is a schematic diagram illustrating an image forming apparatus in which a light emitting diode array is used as a line printer head, according to an embodiment.

Referring to FIG. 13A, a plurality of growth substrates 910A, 910B, and 910C, on which a plurality of light emitting diode layers 930A, 930B, and 930C are respectively formed by epitaxy, are formed. In this regard, a single wafer may be divided into a plurality of pieces to form a plurality of growth substrates. A plurality of separation layers 911A, 911B, and 911C may be interposed between the light emitting diode layers 930A, 930B, and 930C and the growth substrates 910A, 910B, and 910C, respectively, so as to easily separate the plurality of light emitting diode layers 930A, 930B, and 930C from the growth substrates 910A, 910B, and 910C.

Figure 13B:
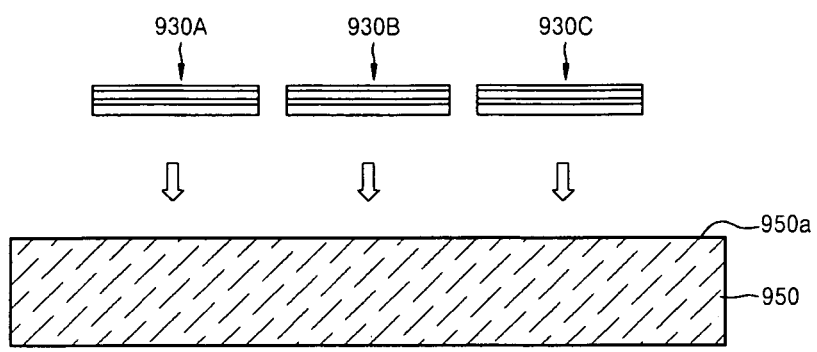
Figure 13C:
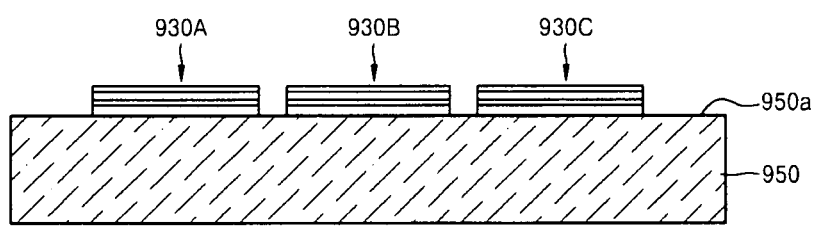

Next, referring to FIGS. 13B and 13C, the plurality of light emitting diode layers 930A, 930B, and 930C are bonded to an upper surface of a large-sized main substrate 950 having an upper surface 950a. The light emitting diode layers 930A, 930B, and 930C may be separated from the growth substrates 910A, 910B, and 910C, respectively, before or after being bonded to the main substrate 950. Furthermore, when a flip-chip bonding method is used, the light emitting diode layers 930A, 930B, and 930C may not be separated from the plurality of growth substrates 910A, 910B, and 910C. The large-sized main substrate 950 may be, for example, a glass substrate which is advantageous for manufacturing a large-surface substrate. A method of forming an active driving circuit on a glass substrate may also be used in manufacturing a liquid crystal display (LCD) panel. According to the embodiment of FIGS. 13A-13G, the large-sized main substrate 950 is used, thereby facilitating the manufacture of a large-surface light emitting diode array.

Figure 13D:
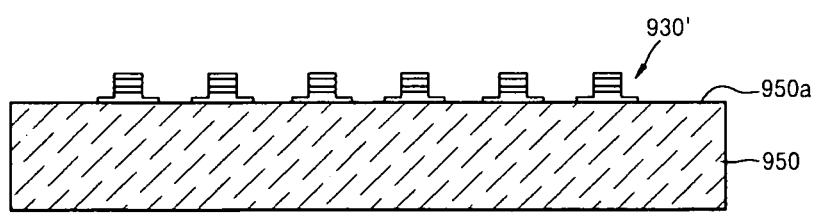

Next, referring to FIG. 13D, the light emitting diode layers 930A, 930B, and 930C is patterned by using a photolithography process and etched into a plurality of light emitting diode structures, and a metal patterning process is performed to form a plurality of light emitting diodes 930'.

Figure 13E:
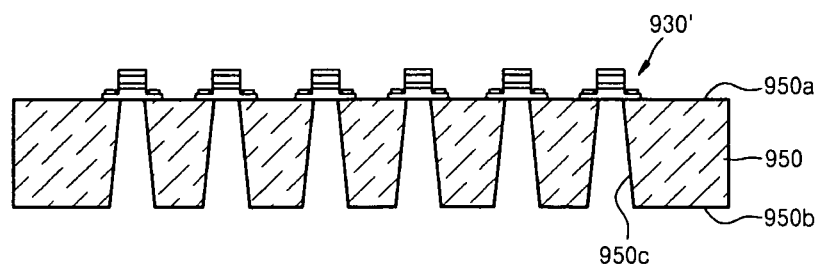
Figure 13F:
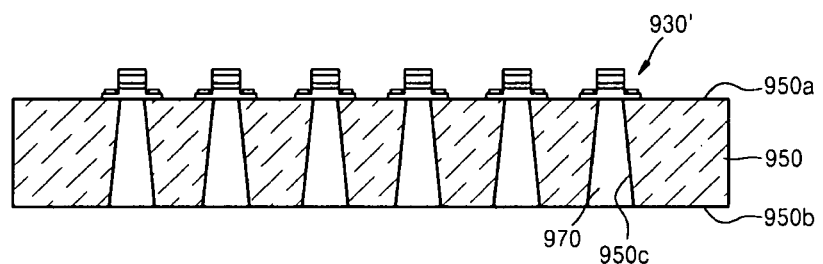

Next, referring to FIGS. 13E and 13F, a plurality of holes 950c are formed in a rear surface 950b of the main substrate 950 until a bottom surface of the light emitting diodes 930' is exposed, and the plurality of holes 950c are filled with a transparent material to form a plurality of apertures 970. Alternatively, the latter operation may be omitted and the plurality of holes 950c may be used as the apertures 970.

Figure 13G:
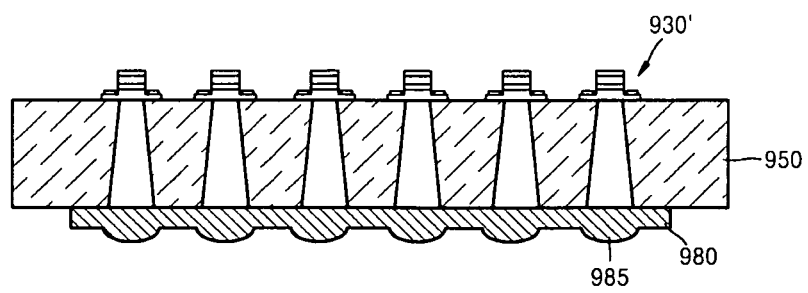

Referring to FIG. 13G, a transparent substrate 980, on a surface of which a plurality of lenses 985 are formed, is bonded to the rear surface 950b of the main substrate 950.

Figure 14:
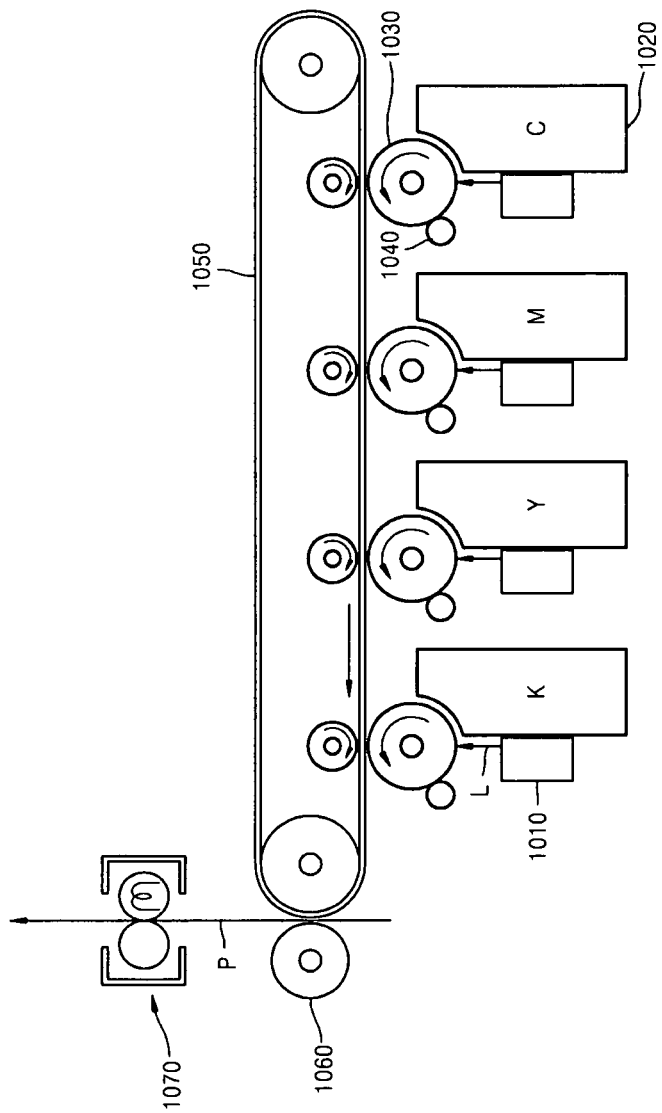
FIG. 14 is a perspective view illustrating one of the line printer heads and its corresponding photosensitive drum of the image forming apparatus of FIG. 13, according to an embodiment.
Figure 15:
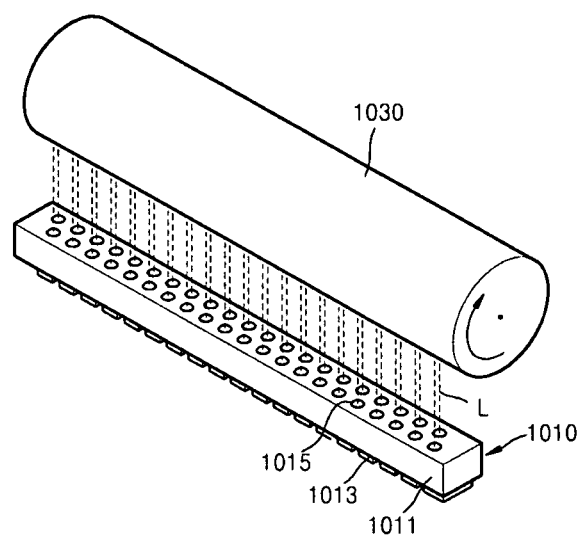
FIG. 15 is a perspective view illustrating a line printer head and a corresponding photosensitive drum of the image forming apparatus of FIG. 14.

FIG. 14 is a schematic diagram of an image forming apparatus in which a light emitting diode array is used as a line printer head, according to an embodiment. FIG. 15 is a perspective view illustrating a line printer head 1010 and a corresponding photosensitive drum 1030 of the image forming apparatus of FIG. 14, according to an embodiment.

Referring to FIG. 14, the image forming apparatus may include line printer heads 1010, developing units 1020, photosensitive drums 1030, charging rollers 1040, an intermediate transfer belt 1050, a transfer roller 1060, and a fixing unit 1070.

The line printer head 1010 scans on a corresponding photosensitive drum 1030 linear light L that is modulated according to image information, and may include the light emitting diode array described with reference to FIGS. 1 through 6. The corresponding photosensitive drum 1030 is an example of a photoreceptor, and includes a photosensitive layer having a predetermined thickness on an outer circumferential surface of a cylindrical metal pipe. The outer circumferential surface of the photosensitive layer of the photosensitive drum 1030 is a surface whereon the light L scanned by the line printer head 1010 forms an image. Also, a belt-type photosensitive belt may be used as a photoreceptor. A corresponding charging roller 1040 is rotated while contacting the photosensitive drum 1030 and charges the surface of the photosensitive drum 1030 to a uniform voltage. A charging bias voltage Vc is applied to the corresponding charging roller 1040. A corona charger (not shown) may be used instead of the corresponding charging roller 1040. Toner is contained in a corresponding developing unit 1020. The toner is transported to the corresponding photosensitive drum 1030 in response to a developing bias voltage applied between the corresponding developing unit 1020 and the photosensitive drum 1030 and develops an electrostatic latent image into a visible toner image. The visible toner image formed on the photosensitive drum 1030 is transferred to the intermediate transfer belt 1050. The toner image is then transferred to a paper P that is transported between the transfer roller 1060 and the intermediate transfer belt 1050 by applying a transfer bias voltage to the charging rollers 1040. The toner image transferred to the paper P is fixed on the paper P by heat and pressure from the fixing unit 1070, thereby completing formation of an image.

In order to print a color image, each of the line printer heads 1010, each of the developing units 1020, and each of the photosensitive drums 1030 corresponding to one color are included. The line printer heads 1010 respectively scan four light beams to the four photosensitive drums 1030. In the four photosensitive drums 1030, electrostatic latent images corresponding to image information of black (K), magenta (M), yellow (Y), and cyan (C) are formed. The four developing units 820 supply toner of black (K), magenta (M), yellow (Y), and cyan (C) colors to the photosensitive drums 1030 to form black (K), magenta (M), yellow (Y), and cyan (C) toner images. The black (K), magenta (M), yellow (Y), and cyan (C) toner images are transferred to the intermediate transfer belt 1050 to overlap thereon, and then are transferred to the paper P.

Referring to FIG. 14, the line printer heads 1010 are disposed several to several tens of mm away from the photosensitive drums 1030, and emit a plurality of light beams L in a main scanning direction onto an outer circumferential surface of the photosensitive drums 1030 according to image information. The line printer head 1010 exposes the photosensitive drum 1030 line-by-line, and a two-dimensional electrostatic latent image is formed on the outer circumferential surface of the photosensitive drum 1030 as the photosensitive drum 1030 is rotated.

The line printer heads 1010 each have the structure of the light emitting diode array in which a plurality of lenses 1015 are formed on a surface of an aperture substrate 1011, and a plurality of light emitting diodes 1013 are formed on a surface opposite to the surface on which the lenses 1015 are formed, to respectively correspond to the plurality of lenses 1015. A driving circuit (not shown) for driving the plurality of light emitting diodes 1013 may be formed on the aperture substrate 1011 as described above, or may be formed separately and be packaged in the line printer heads 1010.

As described above, the plurality of apertures 120 (see FIG. 1) are formed in the aperture substrate 1011, thereby preventing light interference. Light beams L emitted through the plurality of lenses 1015 at equal distances may be formed as images on the outer circumferential surface of the photosensitive drum 1030. A light beam emitted from the light emitting diodes 1013 has a large luminous view angle and is thus diverged, and in order to collimate or focus a plurality of light beams that are usually arranged at several tens of μm, an expensive optical device such as a rod lens array (RLA) is needed. However, in the line printer head 1010, as a plurality of lenses 1015 are arranged on the aperture substrate 1011, no optical unit is required. Accordingly, a simple light scanning optical system may be realized with reduced manufacturing costs. Also, since the line printer head 1010 having a compact size may be manufactured, the degree of freedom in designing an image forming apparatus may also be increased.

According to the above-described embodiments, an image forming apparatus that uses a light emitting diode array as a line printer and forms color images is used therein. However, the light emitting diode array may also be used in an image forming apparatus that forms a mono-color image.

According to the light emitting diode array of the above-described embodiments, the interference of light that is emitted from adjacent light emitting diodes may be prevented with apertures of an aperture substrate. Also, light emitted from the light emitting diodes may proceed parallel or be efficiently focused at a predetermined distance. In addition, the distances between lenses and the light emitting diodes may be kept close and uniform by as much as a thickness of the aperture substrate. Thus, the light beam extraction efficiency of a light emitting diode may be increased and the uniformity of a light beam emitted therefrom may be maintained.

According to a line printer head using the light emitting diode array according to the embodiments, light may be focused on a scanning surface without using an RLA. Also, when the light emitting diode according to the embodiments is used as a line printer head, no RLA is required, and thus, the manufacturing costs of the line printer head may be significantly reduced, and the size of the line printer head may also be reduced, thereby increasing the degree of freedom in designing a printer.

Also, according to a method of manufacturing the light emitting diode array of, a light emitting diode integrated with a lens may be manufactured in one process, thereby reducing manufacturing costs.

Although a few example embodiments have been shown and described, the present disclosure is not limited to the described example embodiments. Instead, it would be appreciated by those skilled in the art that changes may be made to these example embodiments without departing from the principles and spirit of the disclosure, the scope of which is defined by the claims and their equivalents.

What is claimed is:

1. A light emitting diode array comprising:
an aperture substrate formed as a single layer and comprising a plurality of apertures which define light tunnels;
a plurality of light emitting diodes, wherein at least one light emitting diode is bonded directly to the aperture substrate at an incident end of each of the apertures; and
a plurality of lenses that are respectively bonded directly to the aperture substrate at exit ends of the plurality of apertures, wherein light that is emitted from the plurality of light emitting diodes and proceeds through the plurality of apertures is refracted by the plurality of lenses.

2. The light emitting diode array of claim 1, wherein the aperture substrate is a growth substrate on which the plurality of light emitting diodes are formed by epitaxy.

3. The light emitting diode array of claim 1, wherein the aperture substrate is a substrate to which the plurality of light emitting diodes grown on a growth substrate are bonded.

4. The light emitting diode array of claim 3, wherein the plurality of light emitting diodes are compound semiconductors that are separated from the growth substrate and bonded to the aperture substrate.

5. The light emitting diode array of claim 4, wherein each of the plurality of light emitting diodes comprises:
   a first conductivity compound semiconductor layer that is bonded to the aperture substrate;
   an active layer provided on the first conductivity compound semiconductor layer; and
   a second conductivity compound semiconductor layer provided on the active layer.

6. The light emitting diode array of claim 5, wherein each of the plurality of light emitting diodes comprises:
   a first electrode layer provided on a portion of the first conductivity compound semiconductor layer;
   a second electrode layer provided on the second conductivity compound semiconductor layer; and
   an insulation layer,
   wherein the second electrode layer covers a portion of the light emitting diode where the first electrode layer is not formed, and the insulation layer is interposed between the second electrode layer and the second conductivity compound semiconductor layer, the active layer and the first conductivity compound semiconductor layer except for an area where the second electrode layer contacts a top surface of the second conductivity compound semiconductor layer.

7. The light emitting diode array of claim 5, further comprises a reflection layer inserted into the second conductivity compound semiconductor layer.

8. The light emitting diode array of claim 4, wherein each of the plurality of light emitting diodes has a shape of a truncated inverted pyramid.

9. The light emitting diode array of claim 3, further comprising a wiring circuit formed between the light emitting diodes and an incident surface of the aperture substrate,
   wherein the plurality of light emitting diodes are bonded to the wiring circuit by flip-chip bonding.

10. The light emitting diode array of claim 1, wherein the aperture substrate is an integrated circuit (IC) substrate driving the light emitting diodes.

11. The light emitting diode array of claim 1, wherein the plurality of light emitting diodes are compound semiconductors that are separated from the growth substrate and then bonded to the aperture substrate.

12. The light emitting diode array of claim 1, wherein the plurality of light emitting diodes are grown on a growth substrate separate from the aperture substrate and then bonded to the aperture substrate by flip-chip bonding.

13. The light emitting diode array of claim 1, wherein the aperture substrate is a printed circuit board (PCB).

14. The light emitting diode array of claim 1, wherein the plurality of apertures are each a light tunnel that connects an incident surface and an exit surface of the aperture substrate.

15. The light emitting diode array of claim 14, wherein the plurality of apertures respectively at the exit end have a cross-section that is the same as or larger than a cross-section of the plurality of apertures at the incident end.

16. The light emitting diode array of claim 14, wherein the plurality of apertures are respectively holes or filled with a transparent material.

17. The light emitting diode array of claim 14, wherein an outer wall of the plurality of apertures is formed of a reflective material or a light-absorbing material.

18. The light emitting diode array of claim 1, wherein a portion of the incident surface of the aperture substrate where the plurality of the light emitting diodes are not disposed is covered by a reflection layer.

19. The light emitting diode array of claim 1, wherein the plurality of light emitting diodes are arranged in a row or a plurality of rows.

20. The light emitting diode array of claim 19, wherein the plurality of light emitting diodes and the plurality of lenses are arranged such that spots of light beams emitted from the plurality of light emitting diodes and formed as an image on an image plane are at equivalent distances.

21. The light emitting diode array of claim 1, wherein the plurality of lenses have a refractive power according to a curve of a surface of each of the lenses.

22. The light emitting diode array of claim 1, wherein the plurality of lenses comprise a transparent lens layer having a refractive power as a density of impurities at the exit end of the plurality of apertures is differentiated.

23. A line printer head comprising a light emitting diode array emitting light for exposing a photoreceptor in a main scanning direction, wherein the light emitting diode array comprises:
   an aperture substrate formed as a single layer and including a plurality of apertures which define light tunnels;
   a plurality of light emitting diodes, wherein at least one light emitting diode is bonded directly to the aperture substrate at an incident end of each of the apertures; and
   a plurality of lenses that are respectively bonded directly the aperture substrate at to exit ends of the plurality of apertures, wherein light that is emitted from the plurality of light emitting diodes and proceeds through the plurality of apertures is refracted by the plurality of lenses.

24. The line printer head of claim 23, wherein the aperture substrate is a growth substrate on which the plurality of light emitting diodes are crystalline grown, a substrate to which the plurality of light emitting diodes, which are grown on a separate growth substrate, are bonded, an integrated circuit (IC) substrate for driving the plurality of light emitting diodes, or a printed circuit board (PCB).

25. The line printer head of claim 23, wherein the plurality of apertures are respectively light tunnels that connect the incident surfaces and the exit surfaces of the aperture substrates.

26. The line printer head of claim 23, wherein the plurality of light emitting diodes are arranged in a row or a plurality of rows.

27. An electrophotographic image forming apparatus comprising:
   a photosensitive body;
   a line printer head to scan light onto a scanning surface of the photosensitive body to form an electrostatic latent image and comprising a light emitting diode array emitting light that exposes the scanning surface of the photosensitive body in a main scanning direction; and
   a developing unit to supply toner to the electrostatic latent image formed on the photosensitive body to develop the image,
   wherein the light emitting diode array comprises:
   an aperture substrate formed as a single layer and comprising a plurality of apertures which define light tunnels;

a plurality of light emitting diodes respectively bonded directly to the aperture substrate at an incident end of the apertures of the aperture substrate; and a plurality of lenses that are respectively bonded directly to the aperture substrate at an exit end of the plurality of apertures, wherein light that is emitted from the plurality of the light emitting diodes and proceeds through the plurality of apertures is refracted by the plurality of lenses.

28. A method of manufacturing a light emitting diode array, the method comprising:

providing a plurality of light emitting diodes bonded directly to an upper surface of a main substrate;

forming a plurality of apertures in the main substrate to respectively correspond to positions of the plurality of light emitting diodes; and providing a plurality of lenses bonded directly to a rear surface of the main substrate to respectively correspond to positions of the apertures, wherein the main substrate is formed as a single layer.

29. The method of claim 28, wherein the main substrate is a growth substrate on which the plurality of light emitting diodes are formed by epitaxy.

30. The method of claim 28, wherein the providing of the plurality of light emitting diodes on the upper surface of the main substrate comprises:

growing a light emitting diode layer on a separate growth substrate;

bonding the light emitting diode layer to the main substrate; and patterning the light emitting diode layer and forming an electrode to separate the light emitting diode layer into a plurality of light emitting diodes.

31. The method of claim 30, wherein the bonding the light emitting diode layer to the main substrate comprises:

separating the light emitting diode layer from the growth substrate; and bonding the separated light emitting diode layer to the main substrate.

32. The method of claim 31, wherein the growing of the light emitting diode layer further comprises forming a separation layer between the growth substrate and the light emitting diode layer, wherein the separating of the light emitting diode layer from the growth substrate comprises selectively etching to separate the light emitting diode layer from the growth substrate.

33. The method of claim 30, wherein the bonding of the light emitting diode layer to the main substrate comprises:

bonding an upper surface of the light emitting diode layer to the main substrate; and separating the growth substrate from the light emitting diode layer.

34. The method of claim 33, wherein the separating of the growth substrate from the light emitting diode layer comprises removing the growth substrate from the light emitting diode layer comprising selectively etching the whole growth substrate.

35. The method of claim 34, wherein the growing of the light emitting diode layer further comprises forming an etching stopper layer between the growth substrate and the light emitting diode layer.

36. The method of claim 33, wherein the growing of the light emitting diode layer further comprises forming a separation layer between the growth substrate and the light emitting diode layer, and the separating of the growth substrate from the light emitting diode layer comprises selectively etching the separation layer to separate the growth substrate and the light emitting diode layer.

37. The method of claim 30, further comprising providing a wiring circuit on an upper surface of the main substrate, wherein the bonding of the light emitting diode layer to the main substrate comprises bonding an upper surface of the light emitting diode layer to the main substrate by flip-chip bonding.

38. The method of claim 30, wherein the bonding of the light emitting diode layer to the main substrate comprises transferring a plurality of light emitting diode layers onto the main substrate.

39. The method of claim 38, wherein the main substrate is a large-surface glass substrate.

40. The method of claim 30, wherein the main substrate is an integrated circuit (IC) substrate driving the plurality of light emitting diodes.

41. The method of claim 40, wherein the main substrate is a silicon substrate.

42. The method of claim 30, wherein the main substrate is a printed circuit board (PCB), and the providing of a plurality of light emitting diodes comprises:

forming a plurality of light emitting diodes on a growth substrate;

separating the plurality of light emitting diodes from one another; and mounting the plurality of light emitting diodes that are separated on the main substrate.

43. The method of claim 28, wherein the providing of the lenses comprises:

forming a plurality of lenses on a transparent substrate; and arranging the plurality of lenses to respectively correspond to exit ends of the plurality of apertures, and bonding the transparent substrate to a rear surface of the main substrate.

44. The method of claim 43, wherein the plurality of lenses of the transparent substrate are formed using a fusion molding method, a photolithography method, an imprinting method, or an impurity diffusion method.

45. The method of claim 43, wherein in the bonding, the transparent substrate and the light emitting diode layer are bonded to each other using a spin on glass (SOG) method.

46. The method of claim 28, wherein the providing of a plurality of lenses comprises:

bonding a transparent substrate to a rear surface of the main substrate; and forming a plurality of lenses on the transparent substrate to respectively correspond to exit ends of the plurality of apertures.

47. The method of claim 28, wherein the forming of a plurality of apertures comprises forming a plurality of holes in a rear surface of the main substrate to respectively correspond to positions where the plurality of light emitting diodes are formed.

48. The method of claim 47, wherein in the forming of a plurality of holes, a cross-section of the holes at the rear surface of the main substrate is equal to or greater than a cross-section of the holes at the upper surface of the main substrate.

49. The method of claim 48, wherein the plurality of holes are formed using a chemical etching method or a physical etching method.

50. The method of claim 47, wherein the forming of a plurality of apertures further comprises filling the holes of the main substrate with a transparent material.

* * * * *

UNITED STATES PATENT AND TRADEMARK OFFICE
CERTIFICATE OF CORRECTION

| | | |
|---|---|---|
| PATENT NO. | : 8,581,945 B2 | Page 1 of 1 |
| APPLICATION NO. | : 12/923867 | |
| DATED | : November 12, 2013 | |
| INVENTOR(S) | : Seok-Jin Kang et al. | |

It is certified that error appears in the above-identified patent and that said Letters Patent is hereby corrected as shown below:

In the Claims

In Column 18, Line 36, In Claim 23, delete "the aperture substrate at to" and insert -- to the aperture substrate at --, therefor.

Signed and Sealed this
Twenty-fifth Day of March, 2014

Michelle K. Lee
*Deputy Director of the United States Patent and Trademark Office*